(12) United States Patent
Sugino et al.

(10) Patent No.: US 8,809,206 B2
(45) Date of Patent: Aug. 19, 2014

(54) PATTERNED DUMMY WAFERS LOADING IN BATCH TYPE CVD

(75) Inventors: Rinji Sugino, San Jose, CA (US); Bradley Marc Davis, Mountain View, CA (US); Lei Xue, Milpitas, CA (US); Kenichi Ohtsuka, Sunnyvale, CA (US)

(73) Assignee: Spansion LLC, Sunnyvale, CA (US)

( * ) Notice: Subject to any disclaimer, the term of this patent is extended or adjusted under 35 U.S.C. 154(b) by 99 days.

(21) Appl. No.: 13/022,517

(22) Filed: Feb. 7, 2011

(65) Prior Publication Data
US 2012/0202355 A1 Aug. 9, 2012

(51) Int. Cl.
*H01L 21/31* (2006.01)

(52) U.S. Cl.
USPC .......................................................... 438/787

(58) Field of Classification Search
USPC .......... 438/585, 595, 926, 787; 257/E21.626, 257/E21.64, E23.133
See application file for complete search history.

(56) References Cited

U.S. PATENT DOCUMENTS

| | | | |
|---|---|---|---|
| 6,624,078 B1 * | 9/2003 | Ravkin | 438/692 |
| 6,808,944 B1 * | 10/2004 | Jin et al. | 438/14 |
| 2004/0238519 A1 * | 12/2004 | Sakamoto et al. | 219/390 |
| 2006/0029735 A1 * | 2/2006 | Ko | 427/248.1 |
| 2007/0212848 A1 * | 9/2007 | Sandhu et al. | 438/424 |
| 2009/0078197 A1 * | 3/2009 | Takenaga et al. | 118/708 |
| 2009/0117259 A1 * | 5/2009 | Kataoka et al. | 427/9 |
| 2009/0263976 A1 * | 10/2009 | Yamamoto et al. | 438/763 |
| 2011/0065286 A1 * | 3/2011 | Sasaki et al. | 438/770 |

* cited by examiner

*Primary Examiner* — Kevin Parendo
(74) *Attorney, Agent, or Firm* — Sterne, Kessler, Goldstein & Fox PLLC

(57) ABSTRACT

A method for semiconductor device fabrication is provided. The present invention is directed towards using at least one patterned dummy wafer along with one or more product wafers in a film deposition system to create a sidewall layer thickness variation that is substantially uniform across all product wafers. The at least one patterned dummy wafer may have a high density patterned substrate surface with a topography that is different from or substantially similar to a topography of the one or more product wafers. Furthermore, in a batch type Chemical Vapor Deposition (CVD) system, the at least one patterned dummy wafer may be placed near a gas inlet of the CVD system. At least one patterned dummy wafer may be placed near an exhaust of the CVD system. Additionally, the patterned dummy wafers may be reusable in subsequent film deposition processes.

21 Claims, 12 Drawing Sheets

PATTERNED DUMMY WAFERS LOADING IN BATCH TYPE CVD

TECHNICAL FIELD

The present invention relates generally to semiconductor fabrication, and more particularly, but not exclusively to using patterned dummy wafers in a film deposition system.

BACKGROUND

Semiconductors are generally fabricated using a layering process on a wafer substrate. This layering process may include imaging, deposition, etching, doping, and cleaning. The deposition step may be performed by Chemical Vapor Deposition (CVD). CVD is a chemical process used to produce high-purity, high-performance solid materials. In a typical CVD process, the substrate is exposed to one or more volatile precursors, which react and/or decompose on the substrate surface to produce the desired deposit. Frequently, volatile by-products are also produced, which are removed by gas flow through a reaction chamber.

BRIEF DESCRIPTION OF THE DRAWINGS

Non-limiting and non-exhaustive embodiments of the present invention are described with reference to the following drawings. In the drawings, like reference numerals refer to like parts throughout the various figures unless otherwise specified.

For a better understanding of the present invention, reference will be made to the following Detailed Description, which is to be read in association with the accompanying drawings, wherein.

DETAILED DESCRIPTION

The present invention now will be described more fully hereinafter with reference to the accompanying drawings, which form a part hereof, and which show, by way of illustration, specific embodiments by which the invention may be practiced. This invention may, however, be embodied in many different forms and should not be construed as limited to the embodiments set forth herein; rather, these embodiments are provided so that this disclosure will be thorough and complete, and will fully convey the scope of the invention to one skilled in the art.

Throughout the specification and claims, the following terms take the meanings explicitly associated herein, unless the context clearly dictates otherwise. The phrase "in one embodiment" as used herein does not necessarily refer to the same embodiment, though it may. Furthermore, the phrase "in another embodiment" as used herein does not necessarily refer to a different embodiment, although it may. Thus, as described below, various embodiments of the invention may be readily combined, without departing from the scope or spirit of the invention.

In addition, as used herein, the term "or" is an inclusive "or" operator, and is equivalent to the term "and/or," unless the context clearly dictates otherwise. The term "based on" is not exclusive and allows for being based on additional factors not described, unless the context clearly dictates otherwise. In addition, throughout the specification, the meaning of "a," "an," and "the" include plural references. The meaning of "in" includes "in" and "on." The term "coupled" means at least either a direct electrical connection between the items connected, or an indirect connection through one or more passive or active intermediary devices. The term "signal" means at least one current, voltage, charge, temperature, data, or other signal.

Briefly stated, the present invention is directed towards using at least one patterned dummy wafer along with product wafers in a film deposition system to create a wafer sidewall layer thickness variation that is substantially uniform within and across all product wafers. The patterned dummy wafer may have a high density patterned substrate surface that has a topography that is different from or substantially similar to a topography of the product wafers. Additionally, the patterned dummy wafer may have a high density patterned substrate surface that has a pattern density that is different from or substantially similar to a pattern density of the product wafers.

In some embodiments, at least one patterned dummy wafer may be placed near a gas inlet of a Chemical Vapor Deposition (CVD) system. In other embodiments, at least one patterned dummy wafer may be placed near an exhaust of the CVD system. Additionally, the patterned dummy wafers may be reusable in subsequent film deposition processes.

Generalized Operation

Figure 1:
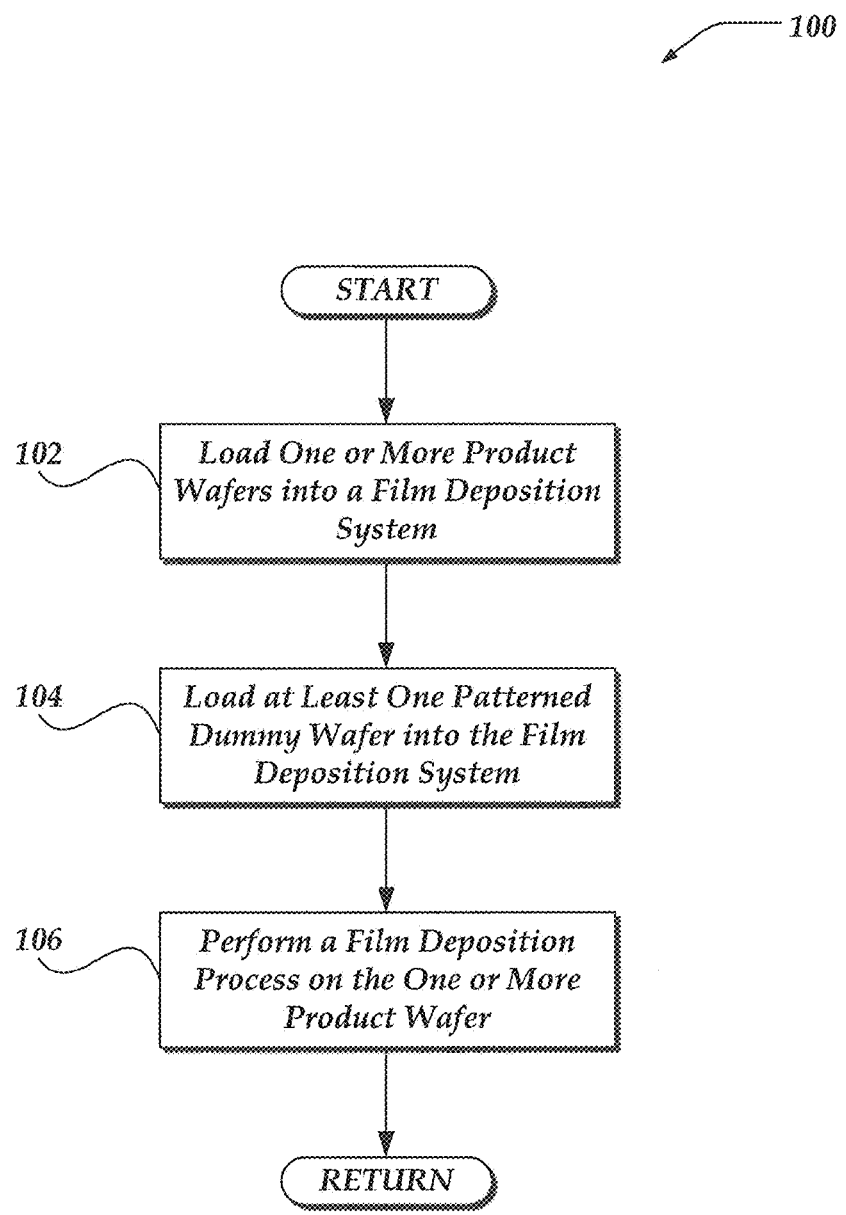
FIG. 1 illustrates a logical flow diagram generally showing one embodiment of an overview process for using patterned dummy wafers in a film deposition system.

FIG. 1 illustrates a logical flow diagram generally showing one embodiment of an overview process for using patterned dummy wafers in a film deposition system.

Process 100 of FIG. 1 begins, after a start block, at block 102, where one or more product wafers are loaded into a film deposition system. As used herein, the term "film deposition system" refers to a system that is used in semiconductor manufacturing to deposit materials onto a substrate surface. Film deposition system may include, but is not limited to, a batch type Chemical Vapor Deposition system. A layout and spacing, i.e. the distance between wafers, of the one or more product wafers in the film deposition system is described in more detail below in conjunction with FIGS. 3A and 3B. Briefly, however, the one or more product wafers may be placed adjacent to each other to create a cylinder-like structure where the spacing between the one or more product wafers may be any suitable spacing between wafers known to one skilled in the art.

In some embodiments, the one or more product wafers may include a patterned substrate surface that has a topography and a pattern density. In one embodiment, the topography includes a shape and a geometry of the patterned substrate surface. In one embodiment, the patterned substrate surface of the one or more product wafers may include a plurality of memory cells in fabrication. The plurality of memory cells in fabrication may become a plurality of functional memory cells upon completion of a semiconductor fabrication process. The plurality of memory cells in fabrication can be PRAM, FeRAM, MRAM, EPROM, flash memory, SRAM, DRAM, or the like.

In one embodiment, each of the one or more product wafers may include a substantially similar patterned substrate surface to each other. In another embodiment, each of the one or more product wafers may include a substantially similar pattern density to each other. Further, in one embodiment, the one or more product wafers may include a different patterned substrate surface from each other. In another embodiment, the one or more product wafers may include a different pattern density from each other.

Proceeding next to block 104, where at least one patterned dummy wafer is loaded into the film deposition system. A layout and spacing of the at least one patterned dummy wafer is described in more detail in conjunction with FIGS. 3A and 3B. Briefly, however, the at least one patterned dummy wafer may be located between a gas inlet of the film deposition system and an exhaust of the film deposition system, such that the at least one patterned dummy wafer is substantially parallel to the one or more product wafers.

A total number of the at least one patterned dummy wafer may be based on a type of film deposition system used, a film material used, a diameter of the product wafers, a pattern density of the product wafers, a number of product wafers used, a topography of the pattern substrate surface of the product wafers, or the like. In some embodiments, the at least one patterned dummy wafer may include a patterned substrate surface that has a topography and a pattern density. In one embodiment the topography includes a shape and a geometry of the patterned substrate surface.

In some embodiments, the patterned substrate surface of the at least one patterned dummy wafer may be made out of materials that have a selectivity for an etchant to remove a deposition layer that may be a result of a film deposition process, such as silicon dioxide ($SiO_2$). In one embodiment, the patterned substrate surface of the at least one patterned dummy wafer may include polycrystalline silicon. In another embodiment, the patterned substrate surface of the at least one patterned dummy wafer may include silicon nitride ($Si_3N_4$). In other embodiments, the at least one patterned dummy wafer may be non-functional as circuitry.

In some embodiments, the at least one patterned dummy wafer may include a plurality of patterned dummy wafers. Thus, in one embodiment, the topography of the patterned substrate surface of each of the patterned dummy wafers may be substantially similar to each other. In another embodiment, the pattern density of each of the patterned dummy wafers may be substantially similar to each other. Further, in one embodiment, the topography of the patterned substrate surface of at least one of the patterned dummy wafers may be different from another one of the patterned dummy wafers. In another embodiment, the pattern density of at least one of the patterned dummy wafers may be different from another one of the patterned dummy wafers.

The at least one patterned dummy wafer may also be similar to or different from the one or more product wafers. In one embodiment, the topography of the patterned substrate surface of the at least one patterned dummy wafer and the topography of the patterned substrate surface of the one or more product wafers may be substantially similar. In another embodiment, the pattern density of the at least one patterned dummy wafer and the pattern density of the one or more product wafers may be substantially similar.

In one embodiment, the topography of the patterned substrate surface of the at least one patterned dummy wafer may be different from the topography of the patterned substrate surface of the one or more product wafers. In another embodiment, the pattern density of the at least one patterned dummy wafer may be different from the pattern density of the one or more product wafers. In one embodiment, the one or more product wafers may have a pattern density greater than the pattern density of the at least one patterned dummy wafer.

The patterned substrate surface of the at least one patterned dummy wafer may also include an effective surface area. The effective surface area can include a three-dimensional surface area. Thus, the effective surface area may include a sidewall surface area of the patterned substrate surface. In some embodiments, the effective surface area of the patterned substrate surface of the at least one patterned dummy wafer may be at least 1.4 times larger than a two-dimensional flat surface area of the at least one patterned dummy wafer. The two-dimensional flat surface area can be defined as $\pi r^2$, where r is the radius of the patterned dummy wafer. In some embodiments the radius may be the radius of the product wafers. In one embodiment, the effective surface area of the patterned substrate surface of the at least one patterned dummy wafer may be at least 1.5 times larger than a two-dimensional flat surface area of the at least one patterned dummy wafer. Further, in some embodiments, the effective surface area of the patterned substrate surface of the at least one patterned dummy wafer may be greater than an effective surface area of the patterned substrate surface of the one or more product wafers.

After the at least one patterned dummy wafer is used in a film deposition process with a set of one or more product wafers, the same at least one patterned dummy wafer may be reused in a subsequent film deposition process. In one embodiment, the subsequent film deposition process may be performed on the same set of one or more product wafers, but at a different stage of a semiconductor fabrication process. In another embodiment, the subsequent film deposition process may be performed on a different set of one or more product wafers.

In some embodiments, the reusable patterned dummy wafers may be reused without any rework or alterations to the patterned dummy wafers. In other embodiments, the patterned dummy wafers may be reworked to remove a film deposition layer. The film deposition layer may be the sidewall material layer that was deposited by the film deposition process that used the patterned dummy wafers. In one embodiment, the sidewall material may be removed by a wet etching process. The wet etching process may use diluted hydrogen fluoride (DHF) as an etchant to remove sidewall material, such as silicon dioxide ($SiO_2$).

Although block 102 and block 104 are shown in a sequential order, the invention is not so limited. Rather, in one embodiment, the actions described at block 102 may be performed prior to the actions described at block 104. In another embodiment, the actions described at block 104 may be performed prior to the actions described at block 102. In yet another embodiment, the actions described at block 104 and the actions described at block 102 can be performed in conjunction with each other.

Continuing to block 106, a film deposition process is performed on the one or more product wafers and the at least one patterned dummy wafer. The film deposition process can be performed after the one or more product wafers and the at least one patterned dummy wafer are loaded into the film deposition system. The film deposition process may create a layer of material on the patterned substrate surface of the one or more product wafers, including a sidewall layer. In one embodiment, the film deposition process may be performed by chemical vapor deposition (CVD).

The film deposition process can deposit different materials at the patterned substrate surface of the one or more product wafers. In one embodiment, the film deposition process deposits a nitride layer on the one or more product wafers. In another embodiment, the film deposition process deposits an oxide layer on the one or more product wafers. In one embodiment, the layer of material may be formed by CVD and may result in a silicon dioxide ($SiO_2$) layer.

Figure 2A:
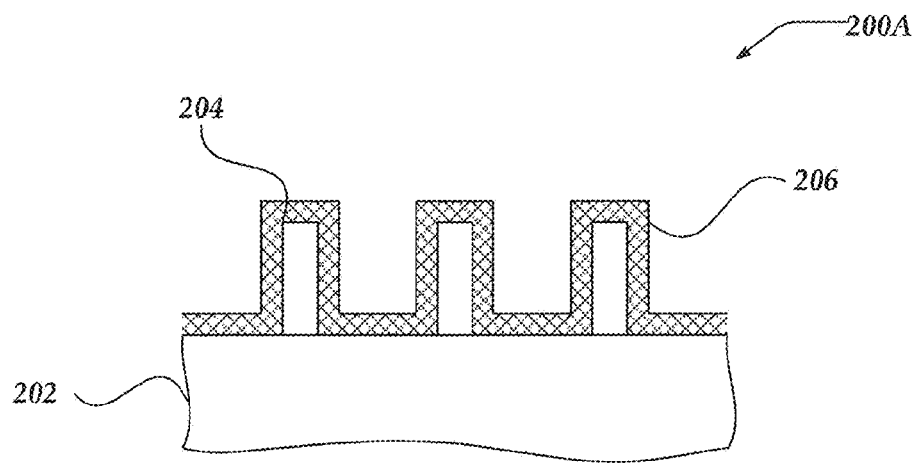
FIG. 2A shows a partial cross-sectional side view of an embodiment of a high density patterned substrate surface.
Figure 2B:
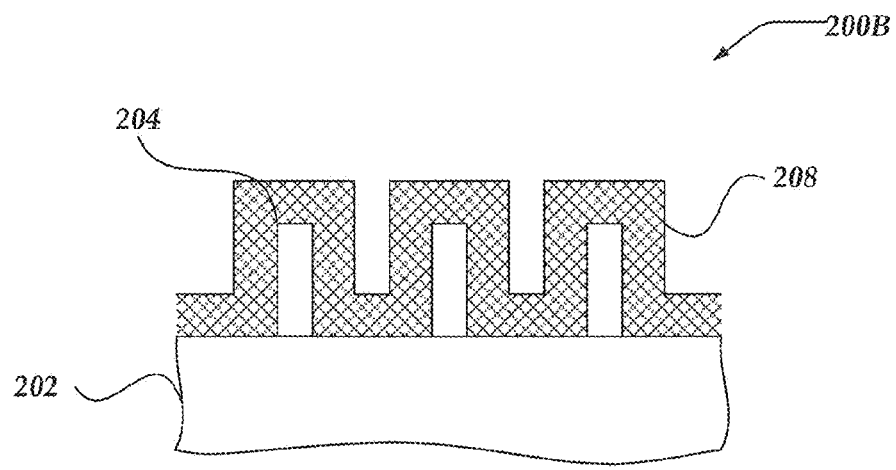
FIG. 2B shows a partial cross-sectional side view of an embodiment of a high density patterned substrate surface.

The sidewall layer created by the film deposition process may have a thickness variation across the surface of the product wafer, which is described in greater detail in conjunction with FIG. 2A and FIG. 2B.

FIG. 2A and FIG. 2B show partial cross-sectional side views of an illustrative embodiment of a product wafer after employing the method of FIG. 1. High density patterned substrate surface 200A may be near a central region of the product wafer. High density patterned substrate surface 200A may include a portion of substrate 202, high density pattern 204, and sidewall material 206. High density pattern 204 may include an existing patterned substrate surface from a previous stage in a semiconductor fabrication process. In one embodiment, high density pattern 204 may include one or more poly gates. In one embodiment, sidewall material 206 may include a silicon dioxide layer.

High density patterned substrate surface 200B may be near an edge region of the product wafer. High density patterned substrate surface 200B may include a portion of substrate 202, high density pattern 204, and sidewall material 208. Since high density patterned substrate surface 200A and 200B are from the same product wafer, substrate 202 of FIG. 2B may be the same substrate as substrate 202 of FIG. 2A. Similarly, sidewall material 208 may include the same material as sidewall material 206. In one embodiment, sidewall material 208 may include a silicon dioxide layer. Further, high density pattern 204 may include an existing patterned substrate surface from a previous stage in the semiconductor fabrication process. In one embodiment, high density pattern 204 may include one or more poly gates.

Since high density patterned substrate surface 200A is located near the center of the product wafer and high density patterned substrate surface 200B is located near an edge of the product wafer, the result of a film deposition process, such as the method of FIG. 1, may result in sidewall material 208 being thicker than sidewall material 206. The use of patterned dummy wafers as taught by the present invention can reduce the thickness variation between sidewall material 208 and sidewall material 206. Additionally, the use of patterned dummy wafers as taught by the present invention can make the thickness variation more uniform between product wafers.

Figure 3A:
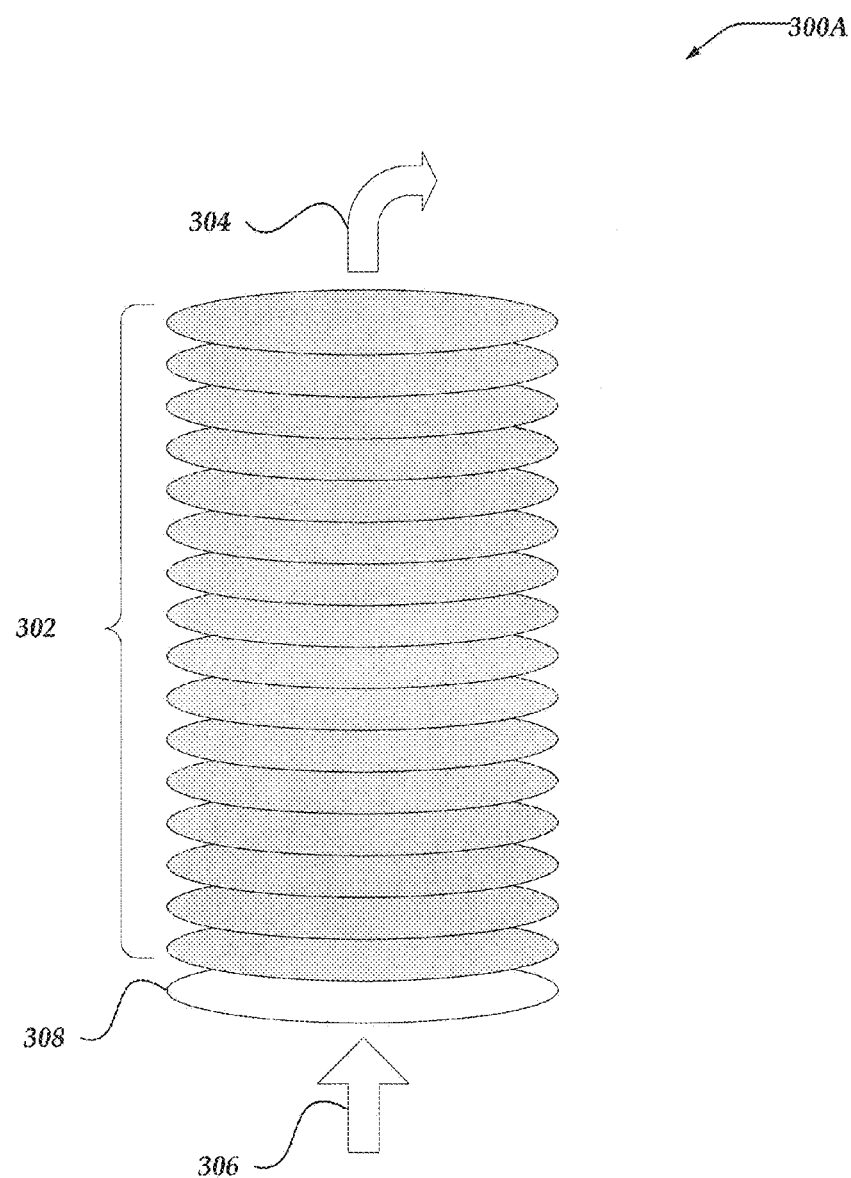
FIG. 3A shows one embodiment of a film deposition system illustrating a system implementing a process using patterned dummy wafers, such as the process shown in FIG. 1.

FIG. 3A shows one embodiment of a film deposition system illustrating a system implementing a process using patterned dummy wafers, such as the process shown in FIG. 1. FIG. 3A may not depict all components of a film deposition system, but one skilled in the art would understand how to implement the present invention in a film deposition system.

Film deposition system 300A may include one or more product wafers 302, an exhaust 304, a gas inlet 306, and at least one patterned dummy wafer 308. The one or more product wafers 302 may be an embodiment of the one or more product wafers described at block 102 of FIG. 1. Similarly, the at least one patterned dummy wafer 308 may be an embodiment of the at least one patterned dummy wafer described at block 104 of FIG. 1.

In a batch type CVD system, product wafers 302 are generally placed adjacent to each other to create a cylinder-like structure. In some embodiments, the batch type CVD system may be vertical. In one embodiment, gas inlet 306 may be at the bottom of the vertical cylinder-like structure of wafers and exhaust 304 may be at the top of the vertical cylinder-like structure of wafers, such as shown in FIG. 3. In another embodiment, gas inlet 306 may be at the top of the vertical cylinder-like structure of wafers and exhaust 304 may be at the bottom of the vertical cylinder-like structure of wafers. Thus, the one or more product wafers may be loaded into the film deposition system and arranged between the inlet of the film deposition system and the exhaust of the film deposition system. However, the invention is not so limited, and other locations for gas inlet 306 and exhaust 304 are within the scope and spirit of this invention.

In other embodiments, the batch type CVD system may be horizontal, where the cylinder-like structure is horizontal. In one embodiment, the gas inlet may be at one end of the horizontal cylinder-like structure of wafers and the exhaust may be at the other end of the horizontal cylinder-like structure of wafers. However, the invention is not so limited, and other locations for the gas inlet and exhaust are within the scope and spirit of this invention. Furthermore, although a vertical system and a horizontal system are described herein, the present invention is not so limited. Rather, film deposition system 300A may include other known film deposition systems.

In some embodiments, at least one patterned dummy wafer may be loaded in the film deposition system and arranged between the inlet of the film deposition system and the exhaust of the film deposition system such that the at least one patterned dummy wafer is substantially parallel to one or more product wafers. In one embodiment, the at least one patterned dummy wafer 308 may be located between the one or more product wafers 302 and gas inlet 306, such that the at least one patterned dummy wafer 308 is substantially parallel to the one or more product wafers 302. Although at least one patterned dummy wafer 308 of FIG. 3A only depicts one patterned dummy wafer, the invention is not so limited. Rather, in some embodiments, the at least one patterned dummy wafer 308 may include a plurality of patterned dummy wafers. In some embodiments, each of the at least one patterned dummy wafer 308 may be substantially similar to each other. In other embodiments, at least one of the at least one patterned dummy wafer 308 may be different from another of the at least one patterned dummy wafer 308.

A spacing between all wafers in a film deposition system, including the one or more product wafers 302 and the at least one patterned dummy wafer 308, may be any suitable spacing between wafers known to one skilled in the art. Therefore, in some embodiments, the spacing between all the wafers may be substantially uniform. In other embodiments, the spacing between the wafers may be irregular.

Figure 3B:
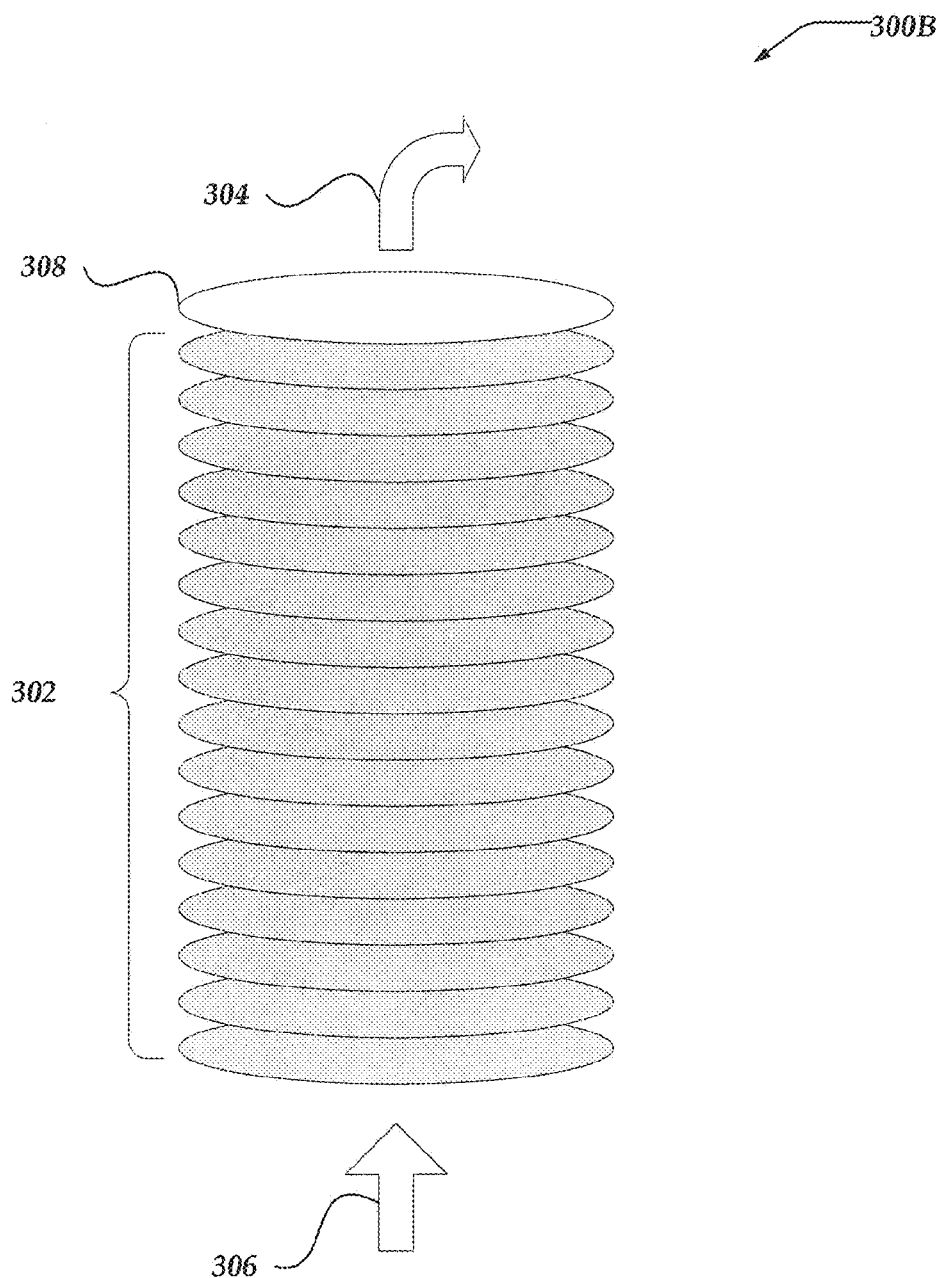
FIG. 3B shows one embodiment of a film deposition system illustrating a system implementing a process using patterned dummy wafers, such as the process shown in FIG. 1.

FIG. 3B shows one embodiment of a film deposition system illustrating a system implementing a process using patterned dummy wafers, such as the process shown in FIG. 1. Film deposition system 300B may be an embodiment of film deposition system 300A of FIG. 3A. Film deposition system 300B may include one or more product wafers 302, an exhaust 304, a gas inlet 306, and at least one patterned dummy wafer 308. In one embodiment, the at least one patterned dummy wafer 308 may be located between the one or more product wafers 302 and exhaust 304, such that the at least one patterned dummy wafer 308 is substantially parallel to the one or more product wafers 302.

Figure 4:
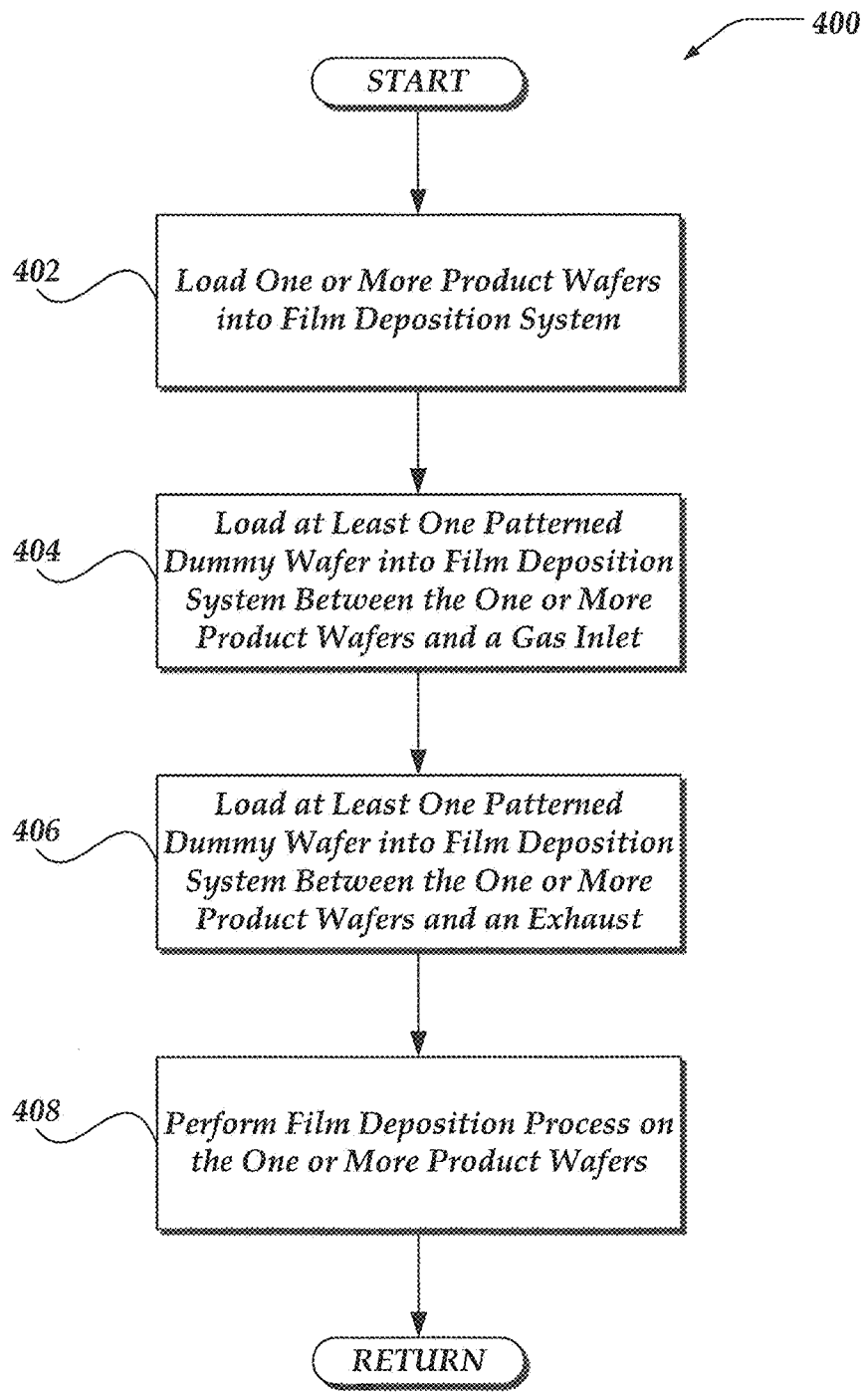
FIG. 4 illustrates a logical flow diagram generally showing one embodiment of an overview process for using patterned dummy wafers in a film deposition system.

FIG. 4 illustrates a logical flow diagram generally showing one embodiment of an overview process for using patterned dummy wafers in a film deposition system.

Process 400 of FIG. 4 begins, after a start block, at block 402, where one or more product wafers are loaded into a film deposition system. The one or more product wafers may be an embodiment of the one or more product wafers 302 of FIG. 3.

Process 400 then proceeds to block 404 where at least one patterned dummy wafer is loaded into the film deposition system between the one or more product wafers and a gas inlet of the film deposition system, such that the at least one patterned dummy wafer is substantially parallel to the one or more product wafers. The at least one patterned dummy wafer may be an embodiment of the at least one patterned dummy wafer 308 of FIG. 3.

Process 400 then proceeds to block 406 where at least one patterned dummy wafer is loaded into the film deposition system between the one or more product wafers and an exhaust of the film deposition system, such that the at least one patterned dummy wafer is substantially parallel to the one or more product wafers. The at least one patterned dummy wafer may an embodiment of the at least one patterned dummy wafer 308 of FIG. 3. Similarly, in one embodiment, the at least one patterned dummy wafer loaded into the film deposition system between the one or more product wafers and the exhaust of the film deposition system may be substantially similar to the at least one patterned dummy wafer loaded into the film deposition system between the one or more product wafers and the gas inlet of the film deposition system.

Although block 402, block 404, and block 406 are shown in a sequential order, the invention is not so limited. Rather, the actions described at block 402, block 404, and block 406 may be performed in any suitable sequence or in conjunction with each other.

Continuing to block 408, a film deposition process is performed on the one or more product wafers and the at least one patterned dummy wafer. The film deposition process can be performed after the one or more product wafers and the at least one patterned dummy wafer are loaded into the film deposition system. The film deposition process described at block 408 may be an embodiment of the film deposition process described at block 106 of FIG. 1.

Figure 5:
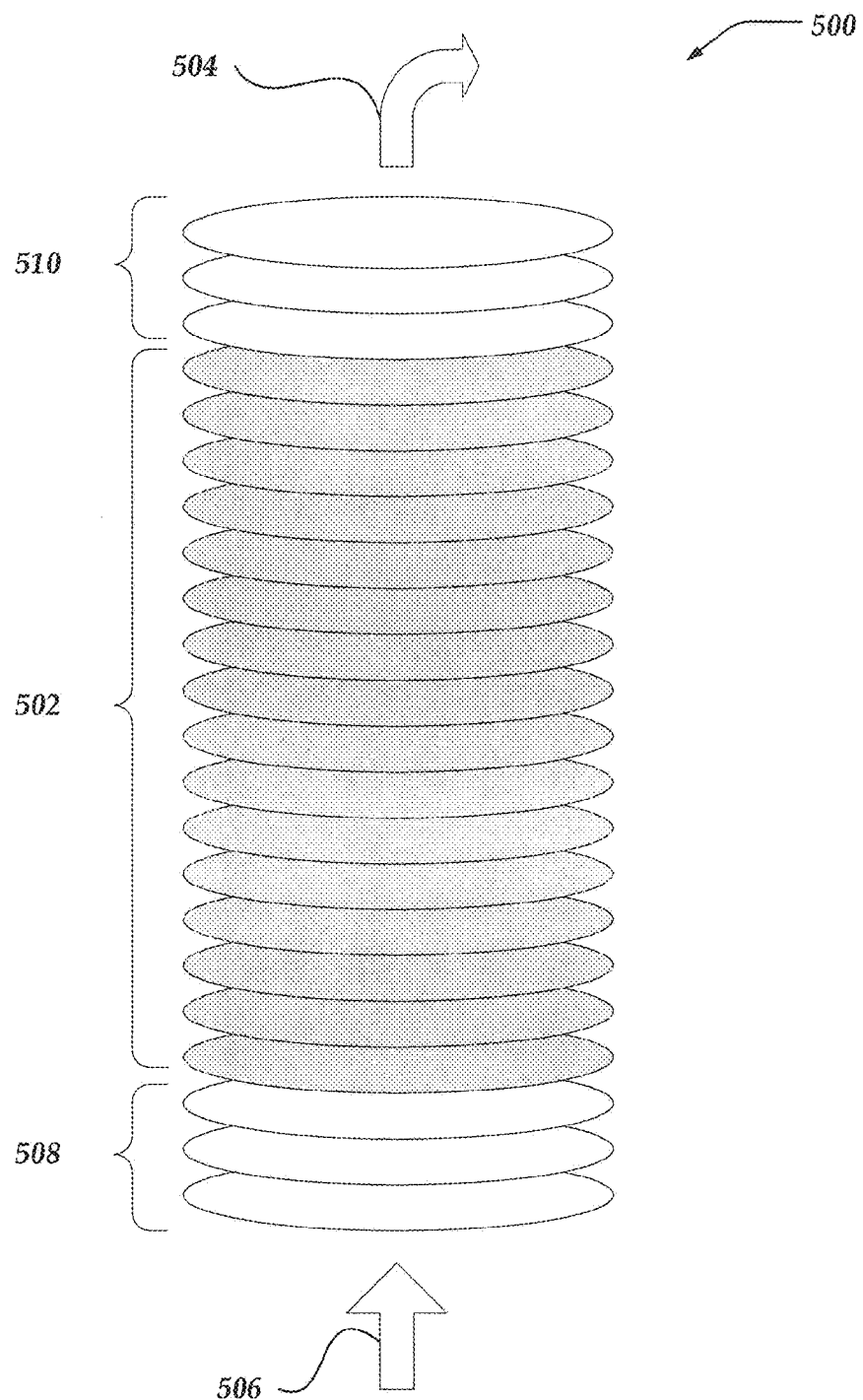
FIG. 5 shows one embodiment of a film deposition system illustrating a system implementing a process using patterned dummy wafers, such as the process shown in FIG. 4.

FIG. 5 shows one embodiment of a film deposition system illustrating a system implementing a process using patterned dummy wafers, such as the process shown in FIG. 4. FIG. 5 may not depict all components of a film deposition system, but one skilled in the art would understand how to implement the present invention in a film deposition system.

In some embodiments, film deposition system 500 may be a film deposition system that employs the method of FIG. 4. Film deposition system 500 may include one or more product wafers 502, an exhaust 504, a gas inlet 506, at least one patterned dummy wafer 508, and at least one patterned dummy wafer 510. The one or more product wafers 502 may be an embodiment of the one or more product wafers described at block 402 of FIG. 4. Further, the at least one patterned dummy wafer 508 may be an embodiment of the at least one patterned dummy wafer described at block 404 of FIG. 4. Additionally, the at least one patterned dummy wafer 510 may be an embodiment of the at least one patterned dummy wafer described at block 406 of FIG. 4.

In one embodiment, the at least one patterned dummy wafer 508 may be located between the one or more product wafers 502 and gas inlet 506 and the at least one patterned dummy wafer 510 may be located between the one or more product wafers 502 and exhaust 504 such that the at least one patterned dummy wafer 508 and the at least one patterned dummy wafer 510 are substantially parallel to the one or more product wafers 502.

In some embodiments, the at least one patterned dummy wafer 508 may be substantially similar to the at least one patterned dummy wafer 510. In one embodiment, the topography of the patterned substrate surface of the at least one patterned dummy wafer 508 may be substantially similar to the topography of the patterned substrate surface of the at least one patterned dummy wafer 510. In another embodiment, the pattern density of the at least one patterned dummy wafer 508 may be substantially similar to the pattern density of the at least one patterned dummy wafer 510. In other embodiments, the at least one patterned dummy wafer 508 may be different from the at least one patterned dummy wafer 510. In one embodiment, the topography of the patterned substrate surfaces of the at least one patterned dummy wafer 508 may be different from the topography of the patterned substrate surfaces of the at least one patterned dummy wafer 510. In another embodiment, the pattern density of the at least one patterned dummy wafer 508 may be different from the pattern density of the at least one patterned dummy wafer 510.

A spacing between all wafers in a film deposition system, including the one or more product wafers 502, the at least one patterned dummy wafer 508, and the at least one patterned dummy wafer 510, may be any suitable spacing between wafers known to one skilled in the art. Therefore, in some embodiments, the spacing between all the wafers may be substantially uniform. In other embodiments, the spacing between all the wafers may be irregular.

Illustration of Example Environment Employing Specific Embodiments of the Present Invention The following is a non-exhaustive and non-limiting illustration of the specific utilization of embodiments of the present invention. The following is not to be construed as limiting; rather, it is an illustration to show an example of an implementation of the embodiments of the present invention.

In this non-limiting illustration, the film deposition system can be a batch type CVD system. In particular, the CVD system may be a vertical batch type CVD system similar to film deposition system 500 of FIG. 5 where the product wafers can be stacked to create a vertical cylinder-like structure. Additionally, the gas inlet may be at the bottom and the exhaust may be at the top of the cylinder-like structure, such as shown in FIG. 5.

The one or more product wafers used for this non-limiting illustration may be product wafers that are being fabricated to include a plurality of flash memory cells. The flash memory cells are described in further detail in conjunction with FIG. 6 and FIG. 7.

Figure 6:
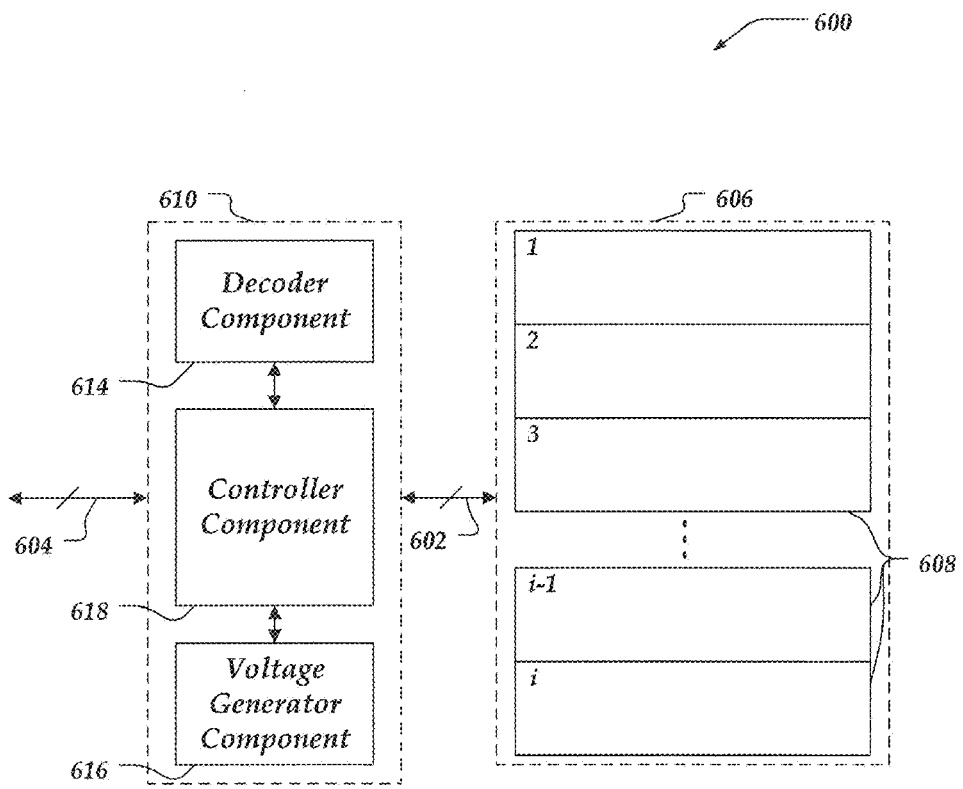
FIG. 6 shows a block diagram of an illustrative memory environment, which may be fabricated employing embodiments of the present invention.

FIG. 6 shows an illustrative memory environment, which may be fabricated employing embodiments of the present invention. Not all the components illustrated in the figures may be required to practice the invention, and variations in the arrangement and type of the components may be made without departing from the spirit or scope of the invention. For example, although primarily described in the context of a flash-based memory, embodiments of the present invention may be employed in manufacturing other types of devices, such as SRAM, DRAM, PRAM, FeRAM, MRAM, EPROM, or the like.

As shown, memory 600 may be a flash-based memory, which includes arrayed memory 606 and memory controller 610. Memory controller 610 is arranged to communicate addressing data and program data over signal path 604. For example, signal path 604 can provide 8, 16, or more I/O lines of data. Memory controller 610 is also configured to access arrayed memory 606 over signal path 602. For example, memory controller 610 can read, write, erase, and perform other operations at portions of arrayed memory 606 via signal path 602. In addition, although shown as single lines, signal path 602 and/or signal path 604 may be distributed across a plurality of signal lines and/or bus lines.

Arrayed memory 606 includes memory sectors 608 (identified individually as sectors 1-i) that can be accessed via memory controller 610. Memory sectors 608 can include, for example, 256, 512, 1024, 2048 or more sectors having memory cells that can be individually or collectively accessed.

Memory controller 610 includes decoder component 612, voltage generator component 614, and controller component 616. Memory controller 610 may be located on the same chip as arrayed memory 606.

Decoder component 612 is arranged to receive memory addresses via addressing signal path 604 and to select individual sectors, arrays, or cells according to the architecture of arrayed memory 606.

Decoder component 612 includes, for example, multiplexer circuits, amplifier circuits, combinational logic, or the like for selecting sectors, arrays, and/or cells based on any of a variety of addressing schemes. For example, a portion of a memory address (or a grouping of bits) can identify a sector within arrayed memory 606 and another portion (or another grouping of bits) can identify a core cell array within a particular sector.

Voltage generator component 614 is arranged to receive one or more supply voltages (not shown) and to provide a variety of reference voltages required for reading, writing, erasing, pre-programming, soft programming, and/or under-erase verifying operations. For example, voltage generator component 614 can include one or more cascode circuits, amplifier circuits, regulator circuits, and/or switch circuits that can be controlled by controller component 616.

Controller component 616 is arranged to coordinate reading, writing, erasing, and other operations of memory 600. In one embodiment, controller component 616 is arranged to receive and transmit data from an upstream system controller (not shown). Such a system controller can include, for example, a processor and a static random access memory (SRAM) that can be loaded with executable processor instructions for communicating over signal path 604.

In one embodiment, memory 600 is a flash-based memory including flash-based memory cells, such as flash-based NAND cells, NOR cells, or hybrids of the two.

Figure 7:
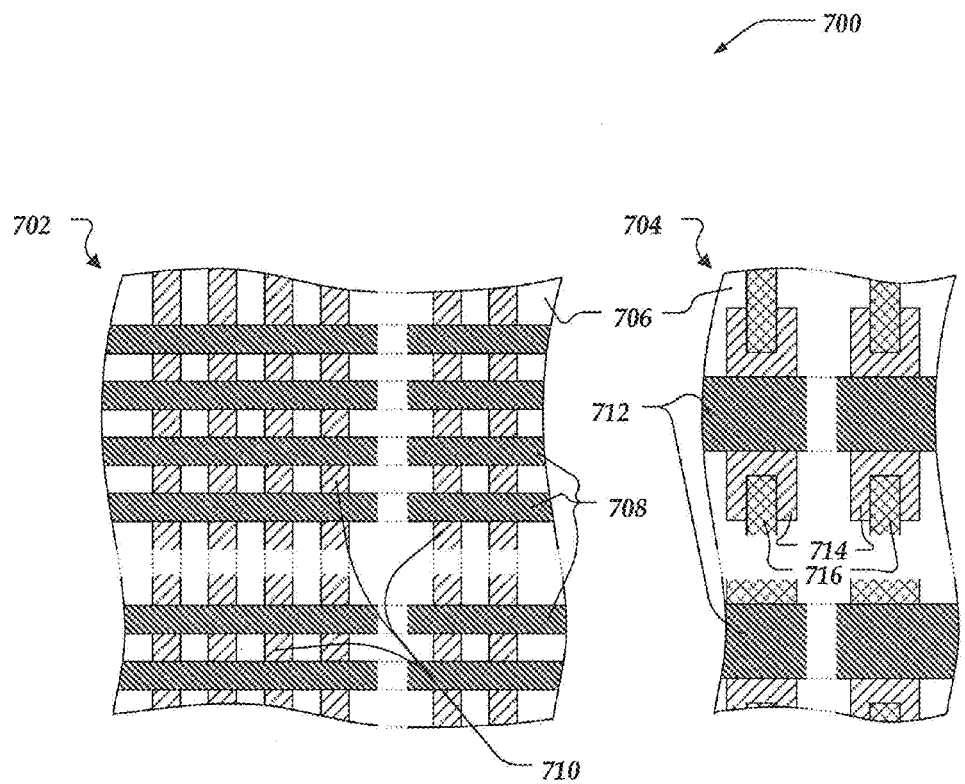
FIG. 7 shows a partial top plane view of an example of core and peripheral sections of a memory that may be employed in the memory of FIG. 6.

FIG. 7 shows a partial top plane view of a non-limiting and non-exhaustive example of core and peripheral sections of a memory that may be employed in the memory of FIG. 6. Core section 702, for example, may be an embodiment of a portion of sector 608 of FIG. 6 and may include arrayed core memory cells. Peripheral section 704, for example, may be an embodiment of memory controller 606 of FIG. 6 or a portion of memory controller 606 of FIG. 6.

Core section 702 includes core polysilicon lines 708, conductive regions 710, and a portion of substrate 706. Portions of core polysilicon lines 708 are coupled to the gates of individual memory cells (not shown in FIG. 6) and can be configured as a word line, a source select gate line, and/or a drain select gate line. Portions of conductive regions 710 can include, for example, p-type and/or n-type doped regions of substrate 706 for forming source/drain regions and/or conductive lines. For example, conductive regions 710 can form portions of bit lines and/or other signal lines. Also, in some embodiments, individual conductive regions 710 extend at least partially underneath individual core polysilicon lines 708.

In one embodiment, core section 702 is arranged in a NOR topology, and individual memory cells can be individually accessed via individual conductive regions 710. In another embodiment, core section 702 is arranged in a NAND topology, and individual memory cells can be accessed though individual conductive regions 710 collectively but not individually. In other embodiments, hybrid architectures can be employed. For example, core section 702 can be configured to have a portion that is NAND-based and another portion that is NOR-based. Also, although not shown in FIG. 7, core section 702 may include any of a variety of interconnect and/or passivation layers, such as dielectric, conductive, or other layers. For example, conductive regions 710 can be positioned beneath a dielectric spacer layer.

Peripheral section 704 includes peripheral polysilicon lines 712, conductive regions 714, and interconnects 716. Portions of peripheral polysilicon lines 712 are coupled to individual peripheral devices (not shown in FIG. 7).

Portions of conductive regions 714 can include, for example, p-type and/or n-type doped regions of substrate 706 for forming conductive features, such as a source, a drain, or other type of well. Interconnects 716 can include conductive lines that electrically intercouple portions of peripheral section 704 and/or electrically couple core section 702 with peripheral section 704. For example, interconnects 716 can include a combination of metal lines and vias. Also, although not shown FIG. 7, peripheral section 704 may also include any of a variety of other interconnect and/or passivation layers.

Figure 8:
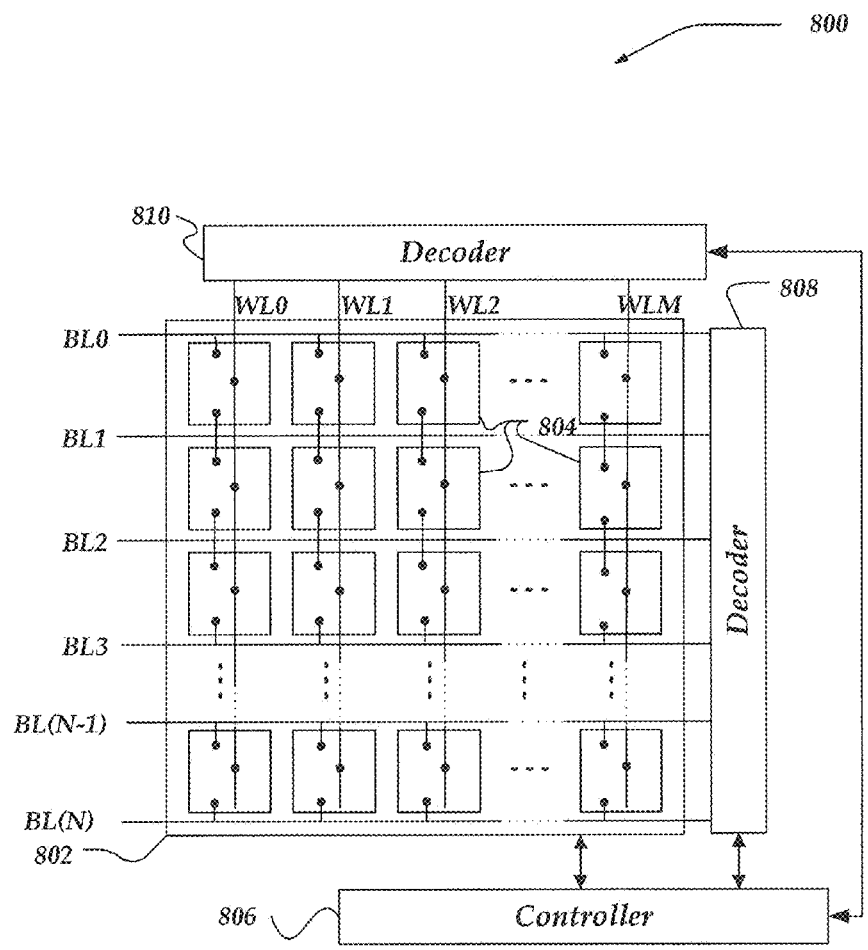
FIG. 8 illustrates a block diagram of an embodiment of a NOR memory array.

FIG. 8 illustrates a block diagram of an embodiment of memory device 800, which may be employed as an embodiment of memory device 600 of FIG. 6. Memory device 800 includes memory array 802 and individual memory cells 804 located within memory array 802. Memory cells 804 are arranged in N+1 rows and M+1 columns in memory array 802. In one embodiment, each row of memory array 802 is accessed by two of the bit lines BL0 to BLN. Each column of memory array 802 is accessed by one of word lines WL0 to WLM. Accordingly, each of memory cells 804 can be accessed by activating the corresponding bit lines and a corresponding word line of the cell. In one embodiment, each column of memory array 802 defines a data word. If N+1 has a value of 8, for example, the cells in each column of memory array 802 define a byte of data.

Memory cells 804 may be flash memory cells which store bits in different ways in different embodiments. In various embodiments, a single cell may store one or more bits. For example, some memory cells are single cell devices, some memory cells are dual cells devices, and in some embodiments, more than one distinct level of threshold voltage may be used to represent more than one bit per cells, as discussed in greater detail below. In some embodiments, flash memory stores information in an array of memory cells made from floating-gate transistors. In, for example, a NOR gate flash, the transistors resemble a standard metal-oxide-semiconductor field-effect transistor ("MOSFET") except that the transistor has two gates, a floating gate and a control gate, instead of one. On top is the control gate ("CG"), as in other metal-oxide-semiconductor transistors, but below this there is a floating gate ("FG") insulated all around by an oxide layer. The FG is interposed between the CG and the MOSFET channel. Because the FG is electrically isolated by an insulating layer, any electrons placed on it are trapped there and, under normal conditions, will not discharge for many years. When the FG holds a charge, it screens (partially cancels) the electric field from the CG, which modifies the threshold voltage ("VT") of the cell. The threshold voltage of a MOSFET is usually defined as the gate voltage where an inversion layer forms at the interface between the insulating layer (oxide) and the substrate (body) of the transistor. During read-out, a voltage is applied to the CG, and the MOSFET channel will become conducting or remain insulating, depending on the VT of the cell, which is in turn controlled by the charge on the FG. The current flow through the MOSFET channel is sensed which permits a determination of the voltage threshold for the device, which in turn provides information about the binary data stored within the device.

In a single cell device, each control gate of a transistor stores a single charge amount that represents the stored information. In its default or "un-programmed" state, it is logically equivalent to a binary "1" value, because current will flow through the channel under application of an appropriate voltage to the control gate.

In a dual cell device, each control gate stores two charge amounts that represent the stored information. That is, two physically distinct quantities of charge are stored on opposite sides of the floating gate. Reading or writing data on one side of the charge storage layer occurs independently of the data that is stored on the opposite side of the floating gate. In this technology, the charge storage layer is split into two mirrored or complementary parts, each of which is formulated for storing independent information. Each dual cell, like a traditional cell, has a gate with a source and a drain. However, in the dual cell the connections to the source and drain may be reversed in operation to permit the storage of the two bits. Each of the memory cells is comprised of multi-layers. A charge-trapping dielectric layer is formed over a semiconductor substrate. The charge-trapping dielectric layer can generally be composed of three separate layers: a first insulating layer, a charge-trapping layer, and a second insulating layer. Word-lines are formed over the charge-trapping dielectric layer substantially perpendicular to the bit lines. Programming circuitry controls two bits per cell by applying a signal to the word-line which acts as a control gate, and changing bit line connections such that one bit is stored by the source and drain being connected in one arrangement and the complementary bit is stored by the source and drain being connected in another arrangement.

In a single-level cell ("SLC") device, each cell stores only one bit of information, either the cell is "un-programmed" (has a "1" value) or "programmed" (has a "0" value). There also exist multi-level cell ("MLC") devices that can store more than one bit per cell by choosing between multiple levels of electrical charge to apply to the floating gates of its cells. In these devices, the amount of current flow is sensed (rather than simply its presence or absence), to determine more precisely the level of charge on the FG.

As one example, a dual cell device may also be a MLC device that stores four-bits-per-cell so that one transistor equates to 16 different states. This enables greater capacity, smaller die sizes and lower costs for the flash devices.

Memory device 800 further includes controller 806, decoder 808, and decoder 810. Decoder 808 and decoder 810 can each receive address bus information from controller 806 and can utilize such information to facilitate accessing or selecting the desired memory cell(s) (e.g., memory location(s)) associated with the command, and to provide the needed voltages to the bit lines (decoder 808) and the word lines (decoder 810) according to timing that is controlled by controller 806.

Decoder 808 may also include a sector decoder in some embodiments. As such, decoder 808 may be arranged to facilitate accessing or selection particular column or grouping of columns within memory device 800. In addition, embodiments of array decoders can be configured to work separately or in conjunction with a sector decoder.

Memory controller 806 is also configured to control the activation and de-activation individual word lines WL0 to WLM for reading, writing, and/or erasing to memory array 802. For example, memory controller 806 can provide a select signal to decoder 810 to select one of the columns WL1 to WLM to activate that column. Further, memory controller 806 can provide a select signal to decoder 808 for selecting particular rows BL0 to BLN (or sector) to be written to or read from.

Figure 9A:
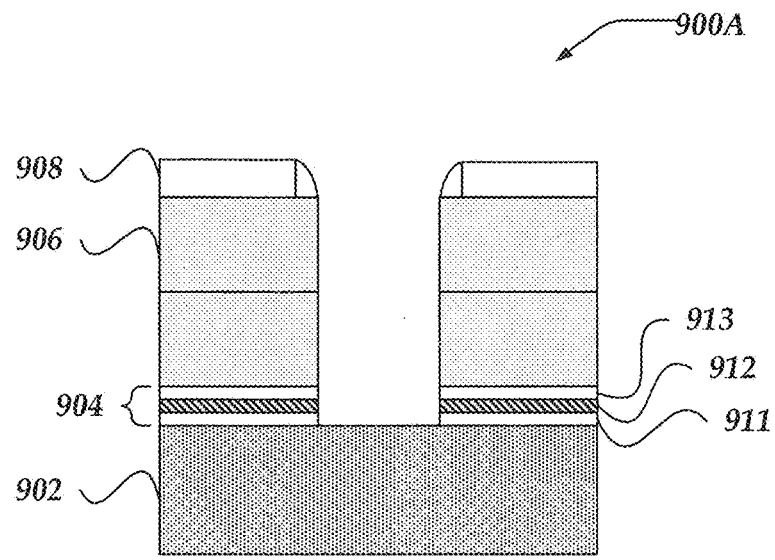
FIG. 9A shows a partial cross-sectional side view of an illustrative example of a core section of a flash memory cell in fabrication.

FIG. 9A shows a partial cross-sectional side view of a non-limiting and non-exhaustive illustrative example of a core section of a flash memory cell, such as memory cell 804 of FIG. 8, in fabrication. Core flash memory cell 900A includes a portion of substrate 902, charge trapping component 904, poly gate 906, and hard mask 908. In some embodiments, charge trapping component 904 is an oxide-nitride-oxide (ONO) layer in which dielectric layer 913 is an oxide (such as $SiO_2$), charge trapping layer 912 is a nitride, and tunneling layer 911 is an oxide (such as $SiO_2$). In one embodiment in which charge trapping layer 912 is a nitride, charge trapping layer 912 may be a silicon-rich nitride (SiRN) such as silicon nitride (SiN). At this stage in the fabrication process, core flash memory cell 900A may be a potion of the patterned substrate surface of a wafer. Thus, the patterned substrate surface of the wafer has a topography that includes at least core flash memory cell 900A in fabrication.

Figure 9B:
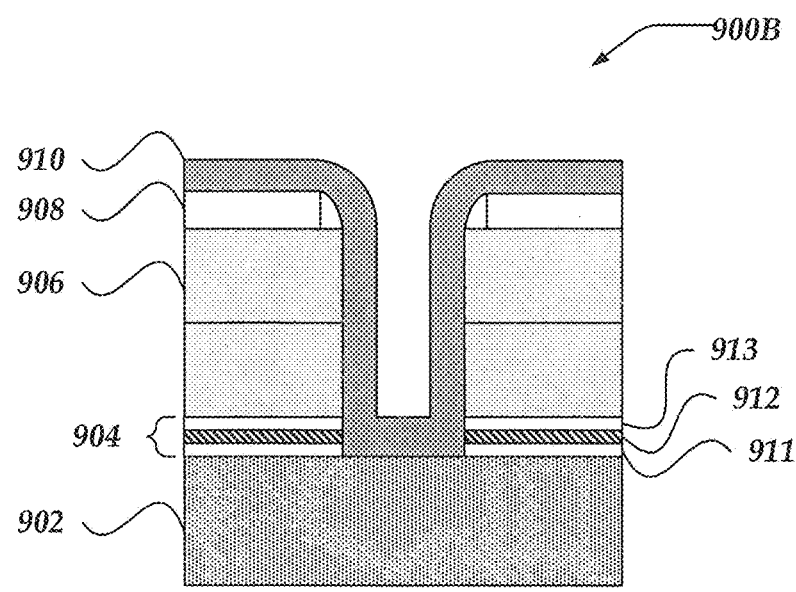
FIG. 9B shows a partial cross-sectional side view of an illustrative example of a core section of a flash memory cell in fabrication employing an embodiment of the present invention.

In this non-limiting illustration, the next step in the fabrication process may be to employ a CVD process to create a layer of silicon dioxide ($SiO_2$) across the one or more product wafers. The result, of this step is illustrated in FIG. 9B. However, prior to the CVD process being performed, patterned dummy wafers may be loaded into the CVD system. Three patterned dummy wafers may be located between the product wafers and the gas inlet, such as shown in FIG. 5. Similarly, three patterned dummy wafers may be located between the product wafers and the exhaust, such as shown in FIG. 5. The location and number of patterned dummy wafers for this illustration are non-limiting and non-exhaustive and other arrangements of patterned dummy wafers may be utilized without departing from the scope and spirit of the present invention.

The patterned dummy wafers may include a patterned substrate surface. The patterned substrate surface can have a topography that is made up of silicon nitride ($Si_3N_4$). To obtain the patterned substrate surface on the patterned dummy wafers, the patterned dummy wafers may go through a fabrication process that utilizes similar techniques as the fabrication process used to create product wafers. However, the number of steps in the fabrication process for the patterned dummy wafers may be very few compared to the number of steps in the fabrication process of the product wafers. For example, the patterned dummy wafer may start as bare silicon. The patterned dummy wafer can then be patterned and etched using bit line or word line masks to create a patterned substrate surface that has a topography and or pattern density similar to the product wafers. Overall, the total number of patterned dummy wafer fabrication steps may be less than 10 steps.

After the patterned dummy wafers are loaded into the CVD system with the product wafers, a CVD process may be used to deposit an oxide spacer at the patterned substrate surface of the one or more product wafers, such that the oxide spacer covers the at least one sidewall of the core flash memory cells in fabrication, such as core flash memory cell 900A of FIG. 9A. The result, of this process is illustrated in FIG. 9B.

FIG. 9B shows a partial cross-sectional side view of an illustrative non-limiting and non-exhaustive example of a core section of a flash memory cell in fabrication employing an embodiment of the present invention. Core flash memory cell 900B may be an embodiment of core flash memory cell 900 of FIG. 9A. Core flash memory cell 900B includes a portion of substrate 902, charge trapping component 904, poly gate 906, hard mask 908, and oxide layer 910. Oxide layer 910 may have a sidewall layer along a sidewall of poly gate 906. In one embodiment, oxide layer 910 may be an oxide spacer. In another embodiment, oxide layer 910 may be an oxide liner.

A sidewall layer of oxide layer 910 may have a thickness that varies depending on a location of the core flash memory cell 900B on a product wafer. The thickness of the sidewall layer of oxide layer 910 may be thinner near a center of the product wafer and thicker near an edge of the product wafer. Thus, each product wafer may have a sidewall layer thickness variation of oxide layer 910. However, the use of the patterned dummy wafers can minimize the thickness variation of the sidewall layer of oxide layer 910 across a single wafer and can make the thickness variation of the sidewall layer of oxide layer 910 more uniform across all product wafers in the batch type CVD system.

Once the CVD process is complete, the patterned dummy wafers may be reused in a subsequent CVD process. As noted above, in this illustration the CVD process creates an $SiO_2$ layer on the product wafers. This process also results in an $SiO_2$ layer on the patterned dummy wafers. As a result, the patterned dummy wafers may be reworked to remove the $SiO_2$. The $SiO_2$ may be removed with a wet etching process that uses diluted hydrogen fluoride as an etchant. Thus, the patterned dummy wafer is "fresh" and can be used again in a subsequent CVD process.

Figure 10A:
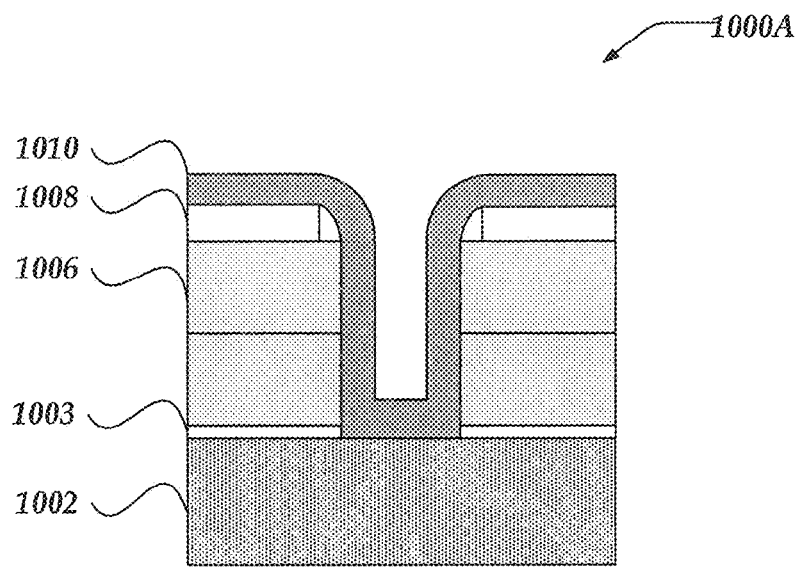
FIG. 10A shows a partial cross-sectional side view of an illustrative example of a semiconductor device in fabrication employing embodiments of the present invention.
Figure 10B:
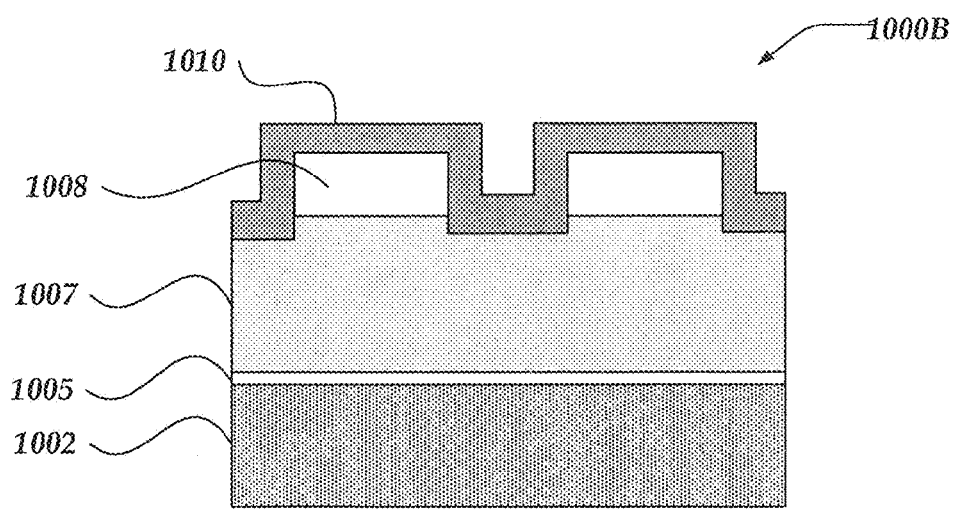
FIG. 10B shows a partial cross-sectional side view of an illustrative example of a flash memory cell in fabrication employing embodiments of the present invention.
Figure 10C:
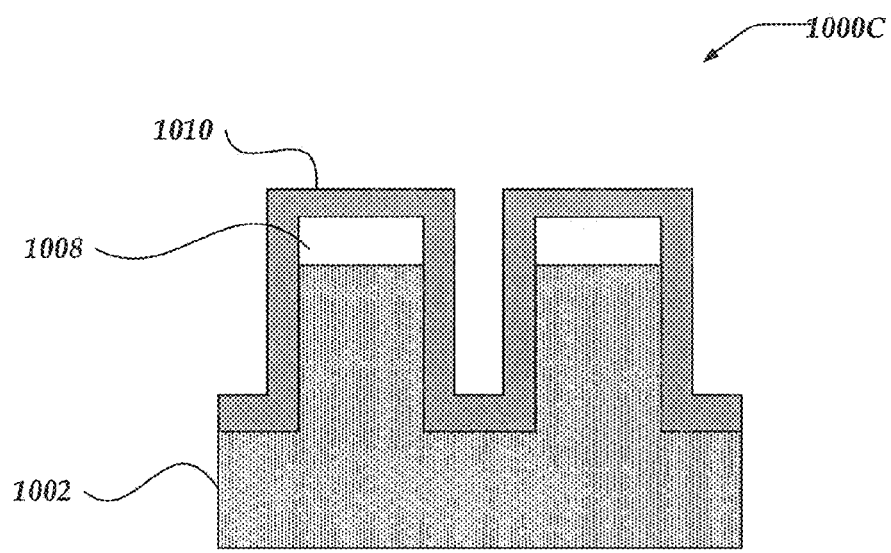
FIG. 10C shows a partial cross-sectional side view of an illustrative example of a semiconductor device in fabrication employing embodiments of the present invention.

Other Illustrations of Example Environments Employing Embodiments of the Present Invention FIGS. 9A and 9B as described above illustrate one particular use case example employing non-limiting and non-exhaustive embodiments of the present invention. The use case described in FIGS. 9A and 9B employ the present invention at a particular stage of the fabrication process. Embodiments of the present invention, however, may be employed during other steps in a fabrication process. FIGS. 10A-10C briefly describe other non-limiting and non-exhaustive steps in a fabrication process where embodiments of the present invention may be employed.

FIG. 10A shows a partial cross-sectional side view of an illustrative example of a semiconductor device in fabrication employing non-limiting and non-exhaustive embodiments of the present invention. Semiconductor device 1000A of FIG. 10A includes a portion of substrate 1002, oxide 1003, poly gate 1006, hard mask 1008, and oxide layer 1010. In some embodiments, semiconductor device 1000A may include a portion of a logic region of a memory device in fabrication. Additionally, oxide layer 1010 may have a sidewall layer along a sidewall of poly gate 1006.

In this non-limiting illustration, oxide layer 1010 may be created during a stage in a fabrication process which may employ a CVD process. Prior to the CVD process being performed, patterned dummy wafers may be loaded into the CVD system. The CVD process may create oxide layer 1010, such as a layer of silicon dioxide ($SiO_2$), across the one or more product wafers. In some embodiments, oxide layer 1010 may be an oxide liner, such that a subsequent spacer deposition step may be performed.

FIG. 10B shows a partial cross-sectional side view of an illustrative example of a flash memory cell in fabrication employing non-limiting and non-exhaustive embodiments of the present invention. Flash memory cell 1000B of FIG. 10B includes a portion of substrate 1002, charge trapping component 1005, poly layer 1007, hard mask 1008, and oxide layer 1010. In some embodiments, charge trapping component 1005 is an oxide-nitride-oxide (ONO). In other embodiments, charge trapping component 1005 may be an oxide. In some embodiments, hard mask 1008 may include one layer. In other embodiments, hard mask 1008 may include a plurality of layers. Thus, hard mask 1008 may have a topography, such that when oxide layer 1010 is deposited onto one or more product wafers, each of the one or more product wafers may have a sidewall thickness variation of oxide layer 1010 across the product wafer.

In this non-limiting illustration, oxide layer 1010 may be created during a stage in a fabrication process which may employ a CVD process. Prior to the CVD process being performed, patterned dummy wafers may be loaded into the CVD system. The CVD process may create oxide layer 1010, such as a layer of silicon dioxide ($SiO_2$), across the one or more product wafers. Oxide layer 1010 may be deposited prior to a poly etch step. Thus, oxide layer 1010 may be an oxide spacer, which may be deposited prior to a poly etch process.

FIG. 10C shows a partial cross-sectional side view of an illustrative example of a semiconductor device in fabrication employing non-limiting and non-exhaustive embodiments of the present invention. Semiconductor device 1000C of FIG. 10C includes a portion of substrate 1002, hard mask 1008, and oxide layer 1010. Oxide layer 1010 may be deposited after a silicon trench etching process.

Thus, after a silicon trench etching process, such as in DRAM fabrication, patterned dummy wafers may be loaded into a CVD system along with product wafers. A CVD process may then be performed that produces oxide layer 1010. In some embodiments, oxide layer 1010 may be an oxide liner suitable for subsequent fabrication steps.

The above illustrations depict specific embodiments of the present invention and are not to be construed as exhaustive or limiting. Rather, the above illustrations provide examples of environments in which the present invention may be employed.

The above specification, examples, and data provide a description of the manufacture and use of the composition of the invention. Since many embodiments of the invention can be made without departing from the spirit and scope of the invention, the invention also resides in the claims hereinafter appended.

What is claimed is:

1. A method for semiconductor device fabrication, the method comprising:
   loading one or more product wafers in a film deposition system, wherein the one or more product wafers includes a patterned substrate surface;
   loading a plurality of dummy wafers in the film deposition system, wherein the plurality of dummy wafers are arranged substantially parallel to the one or more product wafers, wherein at east one of the plurality of dummy wafers has a patterned substrate surface different from another patterned substrate surface of at least one other dummy wafer of the plurality of dummy wafers; and
   performing a film deposition process to create at least a sidewall layer on the patterned substrate surface of the one or more product wafers.

2. The method of claim 1, wherein the plurality of dummy wafers are arranged between the one or more product wafers and an inlet of the film deposition system.

3. The method of claim 1, wherein the plurality of dummy wafers are arranged between the one or more product wafers and an exhaust of the film deposition system.

4. The method of claim 3, wherein the plurality of dummy wafers are further arranged between the one or more product wafers and an inlet of the film deposition system.

5. The method of claim 1, further comprising:
   reusing one or more of the plurality of dummy wafers in a subsequent film deposition process.

6. The method of claim 5, further comprising:
   reworking one or more of the plurality of dummy wafers to remove a film deposition layer.

7. The method of claim 1, wherein a patterned substrate surface of one or more of the plurality of dummy wafers comprises non-functional circuitry.

8. The method of claim 1, wherein the film deposition system further comprises a Chemical Vapor Deposition (CVD) system.

9. The method of claim 1, wherein the patterned substrate surface of the one or more product wafers comprises a plurality of in fabrication memory cells, wherein the plurality of in fabrication memory cells includes at least one of PRAM, FeRAM, MRAM, EPROM, flash memory, SRAM, or DRAM.

10. The method of claim 1, wherein a patterned substrate surface of one or more of the plurality of dummy wafers comprises an effective surface area that is at least 1.5 times larger than a two-dimensional flat surface area of one or more of the plurality of dummy wafers, wherein the two-dimensional flat surface area is $\pi r^2$, where r is the radius of the one or more of the plurality of dummy wafers.

11. The method of claim 1, wherein a pattern density of of one or more of the plurality of dummy wafers is different from a pattern density of the one or more product wafers.

12. The method of claim 1, wherein the patterned substrate surface of the one or more product wafers comprises one or more integrated circuits formed thereon.

13. The method of claim 1, wherein the patterned substrate surface of the one or more product wafers is arranged in the same relative position as a patterned substrate surface of one or more of the plurality of dummy wafers in the film deposition system.

14. A method for memory fabrication, the method comprising:
   loading one or more product wafers in a chemical vapor deposition (CVD) system, wherein the one or more product wafers includes a patterned substrate surface;
   loading a plurality of dummy wafers in the CVD system, wherein the plurality of dummy wafers are arranged substantially parallel to the one or more product wafers, wherein at least one of the plurality of dummy wafers has a patterned substrate surface different from another patterned substrate surface of at least one other dummy wafer of the plurality of dummy wafers; and
   performing a film deposition process to create at least a sidewall layer on the patterned substrate surface of the one or more product wafers.

15. The method of claim 14, wherein the plurality of dummy wafers are arranged between the one or more product wafers and an inlet of the CVD system.

16. The method of claim 14, wherein the plurality of dummy wafers are arranged between the one or more product wafers and an exhaust of the CVD system.

17. The method of claim 16, wherein the plurality of dummy wafers are arranged between the one or more product wafers and an inlet of the CVD system.

18. The method of claim 14, further comprising:
   reusing one or more of the plurality of dummy wafers in a subsequent film deposition process.

19. A method for memory fabrication, the method comprising:
   loading one or more product wafers in a batch type chemical vapor deposition (CVD) system, wherein the one or more product wafers includes a patterned substrate surface with a plurality of core flash memory cells in fabrication with at least one sidewall;
   loading a plurality of dummy wafers in the CVD system, wherein the plurality of dummy wafers are arranged substantially parallel to the one or more product wafers, wherein at least one, of the plurality of dummy wafers has a patterned substrate surface different from another patterned substrate surface of at Jog one other dummy wafer of the plurality of dummy wafers; and
   performing an oxide spacer deposition process that deposits an oxide spacer on the patterned substrate surface of the one or more product wafers, such that the oxide spacer covers the at least one sidewall of the plurality of core flash memory cells in fabrication.

20. The method of claim 19, further comprising:
   reusing one or more of the plurality of dummy wafers in a subsequent film deposition process.

21. A method for semiconductor device fabrication, comprising:
   loading one or more product wafers in a film deposition system that has at least an inlet and an exhaust, wherein the one or more product wafers are arranged between the inlet of the film deposition system and the exhaust of the film deposition system, and wherein the one or more product wafers includes a patterned substrate surface;
   loading at least one patterned dummy wafer in the film deposition system, wherein the at least one patterned dummy wafer is arranged between the inlet of the film deposition system and the exhaust of the film deposition system such that the at least one patterned dummy wafer is substantially parallel to the one or more product wafers, and wherein the at least one patterned dummy wafer includes a plurality of patterned dummy wafers, such that a patterned substrate surface of at least one of the plurality of patterned dummy wafers is different from a patterned substrate surface of at least one other patterned dummy wafer of the plurality of patterned dummy wafers; and performing a film deposition process to create at least a sidewall layer on the patterned substrate surface of the one or more product wafers.

* * * * *

UNITED STATES PATENT AND TRADEMARK OFFICE
CERTIFICATE OF CORRECTION

PATENT NO. : 8,809,206 B2  
APPLICATION NO. : 13/022517  
DATED : August 19, 2014  
INVENTOR(S) : Sugino et al.

Page 1 of 1

It is certified that error appears in the above-identified patent and that said Letters Patent is hereby corrected as shown below:

In the Claims:

Claim 11, column 15, line 60, "density of of" should read --density of--; and

Claim 19, column 16, line 43, "at Jog one" should read --at least one--.

Signed and Sealed this  
Ninth Day of December, 2014

Michelle K. Lee  
*Deputy Director of the United States Patent and Trademark Office*